United States Patent [19]

Jackson

[11] 3,758,830

[45] Sept. 11, 1973

[54] TRANSDUCER FORMED IN PERIPHERALLY SUPPORTED THIN SEMICONDUCTOR WEB

[75] Inventor: Weldon H. Jackson, Sunnyvale, Calif.

[73] Assignee: Hewlett-Packard Company, Palo Alto, Calif.

[22] Filed: Apr. 10, 1972

[21] Appl. No.: 242,606

[52] U.S. Cl. .... 317/234 R, 317/234 M, 317/255 Q, 73/88 SD

[51] Int. Cl. .......... H01l 3/00, H01l 5/00

[58] Field of Search .......... 317/235, 26, 29, 317/29.1; 310/4; 73/88 SD

[56] References Cited

UNITED STATES PATENTS

| | | | |
|---|---|---|---|
| 3,292,057 | 12/1966 | Touchy | 317/235 |
| 3,294,988 | 12/1966 | Packard | 317/235 |
| 3,337,780 | 8/1967 | Robbins | 317/235 |
| 3,406,366 | 10/1968 | Kontrimas | 317/234 |
| 3,492,513 | 1/1970 | Hollander et al. | 317/235 M |
| 3,568,124 | 3/1971 | Sonderegger | 317/235 M |
| 3,675,140 | 7/1972 | Fang et al. | 317/235 M |

*Primary Examiner*—John W. Huckert
*Assistant Examiner*—Andrew J. James
*Attorney*—Patrick J. Barrett

[57] ABSTRACT

A thin web supported by a peripheral frame is formed from a single crystal of silicon, the web and frame being of opposite conductivity types. A lower resistivity region is diffused into the web, and the web is covered by an insulating layer having holes through which conductors are deposited in contact with each end of the diffused region. The resulting transducer can be used as a thermocouple or strain gage. For use as a thermocouple, one of the junctions between the diffused region and a conductor is situated near the center portion of the web. The diffused region comprises one leg of the thermocouple, and one of the conductors functions as the other leg. The frame acts as a heat sink relative to the center portion of the web, making the junction near the center portion a hot junction and the junction near the frame a cold junction. For use as a diaphragm type strain gage the diffused region is made to transverse most of the web. The frame serves as a mounting base that is integral with the strain gage. The resistance of the diffused region changes in proportion to the change of the dimensions of the diffused region that result from the application of a force normal to the plane of the web.

7 Claims, 6 Drawing Figures

TRANSDUCER FORMED IN PERIPHERALLY SUPPORTED THIN SEMICONDUCTOR WEB

BACKGROUND OF THE INVENTION

Thin film vacuum deposition techniques have been used in the past to fabricate miniaturized thermocouples. Usually a thin, insulating substrate is supported by a thicker conductive frame and the thermocouple elements are formed by the deposition of dissimilar metals on the substrate. While such devices can be made small, they are usually limited in speed of response by the thermal properties of the substrate. Thermocouples have also been built using discrete, uniformly doped semiconductor elements connected to metal conductors and these thermocouples have significantly higher Seebeck coefficients than metallic, thin film thermocouples. However, the resistive properties of semiconductor thermocouples are not suitable for applications in which they are self-heated by passing a current through them or by absorbing electromagnetic radiation. Typically, the resistivity of a highly doped semiconductor is relatively low and highly temperature dependent.

Diaphragm type strain gages have previously been made by bonding a strain sensitive element to a relatively rigid frame or base. Invariably there is some hysteresis in the gage response due to the bond between the strain sensitive element and the base. This hysteresis adversely affects the repeatability and accuracy of a strain gage.

SUMMARY OF THE INVENTION

The present invention comprises a semiconductor web and a supporting frame formed out of a piece of single-crystal silicon. The web is an epitaxial layer grown on an oppositely doped substrate with a protective dielectric layer such as silicon oxide formed over the web. The frame is formed by removing part of that substrate by preferential etching through the substrate to the epitaxial layer. For the thermocouple application of the transducer, one leg of a thermocouple comprises a higher conductivity region formed in the web by diffusion. The second leg of the thermocouple is a conductor, deposited on the dielectric layer, and having one end in contact with the diffused legion through an opening in the dielectric layer and another end situated over the frame. Heat conductance of the semiconductor web is low compared to that of the frame. Thus if the thermocouple is heated, the junction between the diffused region and the conductor forms the hot junction of the thermocouple, and contacts are attached to the diffused region and to the conductor near the frame forming cold junctions. The frame acts as a heat sink to keep the two contacts at approximately the same temperature. The speed of response of such a thermocouple is significantly greater than that of prior art devices because of the higher thermal conductivity and lower heat capacity of the silicon web. Since the resistivity of the diffused leg of the thermocouple is usually too low for self-heating applications, the resistive properties of the device can be optimized by the proper selection of a metal for the second leg of the thermocouple.

For the strain gage application the strain sensitive element comprises a relatively narrow, diffused region in extending across most of the web. conductors are deposited in contact with the diffused region at each end thereof to provide contacts. The frame provides a rigid, hysteresis-free support for the web as well as a mounting base for the strain gage. To measure a pressure differential the strain gage is mounted so that the differential is across the web. Because the whole device is monolithic there is no intervening bond between the strain gage and the mounting base to introduce hysteresis problems.

DESCRIPTION OF THE PREFERRED EMBODIMENT

Figure 1:
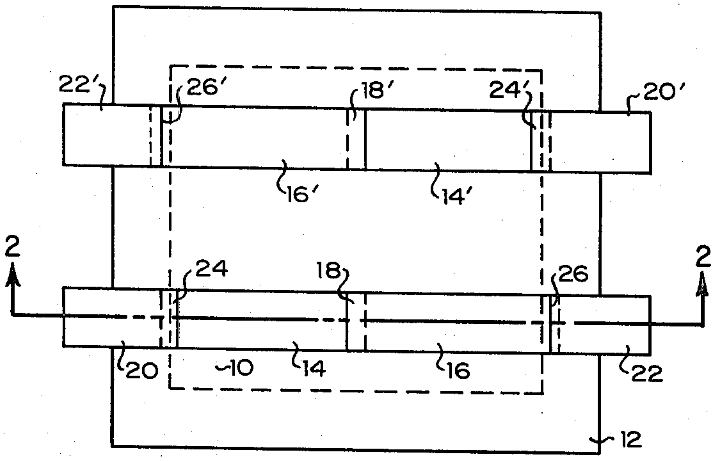
FIG. 1 is a plan view of a pair of transducers of the present invention.
Figure 2:
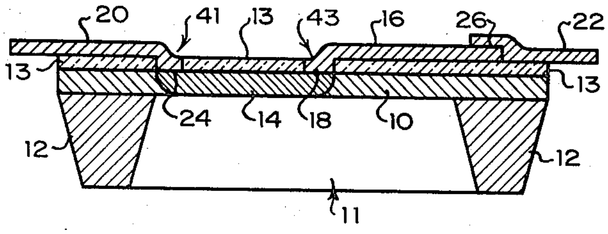
FIG. 2 is a sectional view of FIG. 1.

FIGS. 1 and 2 illustrate the thermocouple application of the transducer of the present invention. A web 10 of N-doped semiconductor material is epitaxially grown on a P-doped semi-conductor substrate such as silicon. The center portion 11 of the substrate is then preferentially etched away to make a frame 12, supporting web 10, using a passivating bias etching technique described by H. A. Waggener in the *Bell System Technical Journal*, Vol. 49, No. 3, page 473 (March, 1970). This technique involves using an etchant which etches faster along some crystallographic axes than along others. The material for frame 12 is crystallographically oriented so that the direction of faster etch is along the smallest dimension, i.e., the thickness which is normal to the surface of the web, and slower along dimensions substantially parallel to the surface of the web, i.e., the length and width of the frame.

A more heavily doped region 14 of lower resistivity is formed by diffusion of an impurity or dopant into web 10. This region may have, for example, a conductivity of 10 ohms per square as compared with 10,000 ohms per square for the less heavily doped web material although the resistance ratio can be as small as 100:1. Region 14 comprises a first leg of a thermocouple. Next an insulating layer 13 such as silicon oxide is formed over the web, leaving openings 41 and 43. A conductor 16 having a relatively high resistivity, such as $Ta_2N$, is then deposited on the insulating layer, forming an ohmic junction 18 through opening 43 with region 14 and comprising a second leg of the thermocouple. A lead 20 is deposited on insulating layer 13 and in contact with region 14 through opening 41, near frame 12, to make an ohmic junction 24. Likewise a lead 22 is deposited in contact with conductor 16 near frame 12 to make a junction 26. The leads may be gold beam leads such as those described by M. P. Lepselter in the *Bell System Technical Journal*, Vol. 45, No. 2, pages 233–253 (February, 1966).

The cross-sectional area of frame 12 is much greater than that of web 10: web 10 is typically 3 micrometers thick by 400 micrometers square and a frame section may typically be 75 micrometers thick by 130 micrometers wide at the top and 75 micrometers at the bottom. Heat conductance will thus be significantly greater in the frame than in the web. If power is dissipated in the thermocouple, junction 18 will rise higher in temperature than frame 12 due to the higher thermal resistance of web 10. Frame 12 will act as a heat sink and will keep junctions 24 and 26 at approximately the same temperature. Thus in use junction 18 will be what is commonly referred to as a hot junction and junctions 24 and 26 will comprise cold junctions.

Figure 3:
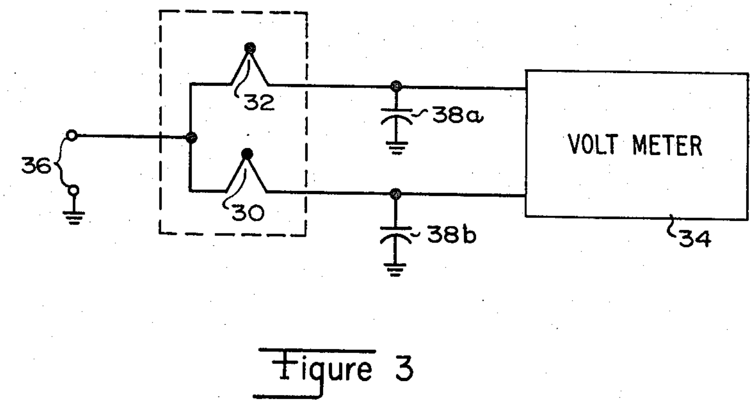
FIG. 3 is a schematic view of one application of the present invention.

As shown in FIG. 1, more than one thermocouple can be placed in series to form a thermopile. Elements in the second thermocouple comparable to those in the first are labeled with primed reference numerals. One use for the pair of thermocouples illustrated in FIG. 1 is as a transducer in an R.F. power meter shown in FIG. 3. Two thermocouples 30 and 32 are connected in series, and the series combination is connected to the input of a sensitive voltmeter 34. The R.F. signal to be measured is connected to input 36. Since capacitors 38*a* and b, connected from each voltmeter input to ground, appear as shorts to the R.F. signal, thermocouples 30 and 32 act as parallel load resistors to the signal. Ideally the resistance value of the parallel combination of the thermocouples is eqaul to the characteristic impedance of the transmission line carrying the R.F. signal. If the impedances are thus matched, all the signal power will be dissipated in the thermocouples, raising their temperature proportionately. Voltmeter 34 will then measure a voltage proportional to the temperature rise and thus proportional to the power of the R.F. signal.

The technique of passing the signal to be measured through the thermocouple is known as direct heating. The thermocouple disclosed herein can also be indirectly heated by, for example, placing a radiation absorbing material over junction 18. The junction temperature rise will then be proportional to the radiation absorbed. The thermocouple can also be indirectly heated by depositing a heater, such as a resistor, on the web next to the thermocouple and then passing the signal to be measured through the heater. As above, several thermocouples can be combined to form a thermopile for these applications.

Figure 4:
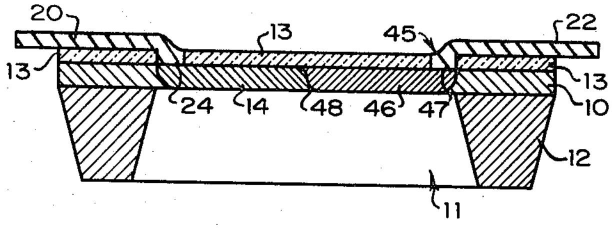
FIG. 4 is a sectional view of another embodiment of the present invention.

A temperature sensor can also be formed in the web by diffusing two oppositely doped regions adjacent each other to form a junction diode. As shown in FIG. 4, the sensor is similar to FIG. 2 except that instead of material 16 a highly P-doped region 46 is diffused into web 10 to form a P-N junction 48 with region 14. Lead 22 makes an ohmic junction 47 with region 46 through an opening 45 in insulating layer 13. When the diode is forward biased, the voltage drop across it will depend upon the temperature of junction 48, thus providing a good measure of the temperature of the web.

Although web 10 has so far been described as N-doped and frame 12 as P-doped, the doping could be reversed. Region 14 can be either N- or P-doped irrespective of the doping of web 10. Alternatively a thermocouple can be formed in web 10 by forming adjacent N- and P-doped diffused regions and connecting these regions with a conductor.

Figure 5:
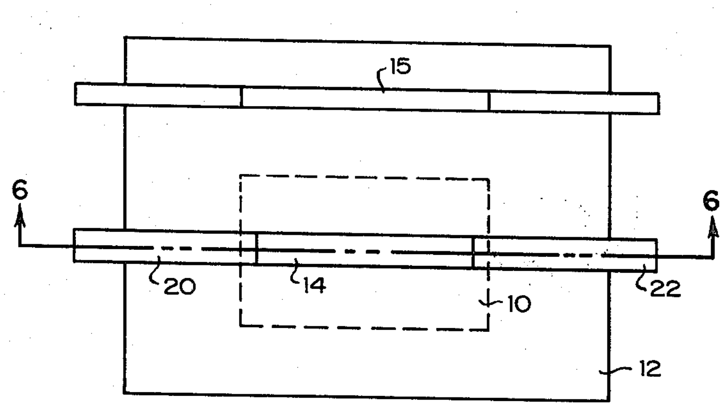
FIG. 5 is a plan view of still another embodiment of the present invention.
Figure 6:
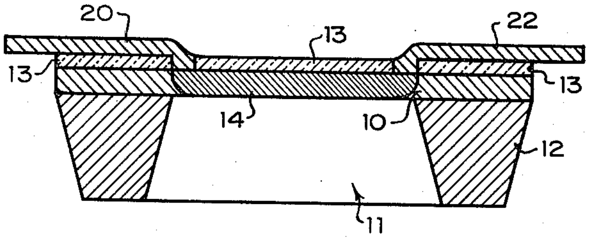
FIG. 6 is a sectional view of FIG. 5.

The strain gage application of the transducer of the present invention is shown in FIGS. 5 and 6. The web 10, frame 12, insulating layer 13 and diffused region 14 are fabricated as previously described, as are leads 20 and 22. The diffused region is illustrated as extending over substantially the entire width of the web, however, one or more strain gages could be formed in a small portion of web 10. Relatively thin metal conductors may be used between the strain gage and leads 20 and 22 if the gages do not extend near frame 12. In such a case the thinner conductors would probably be of the same material as leads 20 and 22. Another diffused region 15 may be included over the frame 12 to act as a temperature compensation element, since it will experience all of the temperature changes region 14 does, but will not experience the strain. One typical use for such a strain gage is in a pressure transducer in which a pressure differential across web 10 induces a strain in the web.

I claim:

1. A transducer comprising:

a single-crystal, semiconductor support member having a frame portion of a first conductivity type and a web portion, thinner than the frame portion, of a second conductivity type;

a sensing region of lower resistivity than the web portion formed in the web portion;

an insulating layer substantially covering the web portion;

a first conductor supported on the insulating layer and making electrical contact with a first portion of the sensing region through a first opening in the insulating layer; and a second conductr supported on the insulating layer and making electrical contact with a second portion of the sensing region through a second opening in the insulating layer.

2. A transducer as in claim 1 including a third conductor supported on the insulating layer wherein:

the frame portion is peripheral;

the first portion of the sensing region is near the center of the web portion;

the sensing region forms a first leg of the thermocouple;

the first conductor forms a second leg of the thermocouple;

the contact between the first portion of the sensing region and the first conductor forms a first thermocouple junction; and the third conductor makes contact with the first conductor near the frame portion, and the second portion of the sensing region makes contact with the second conductor near the frame portion, the contact between the second portion of the sensing region and the second conductor and between the first and third metals forming second thermocouple junctions.

3. A transducer as in claim 2 wherein the doping of the sensing region is non-uniform along a direction normal to the surface of the web portion.

4. A transducer as in claim 3 wherein:

the frame portion is P-conductivity type; and the web portion and the sensing region are N-conductivity type.

5. A transducer as in claim 1 wherein:

the frame portion is peripheral;

the contact between the first conductor and the first portion of the sensing region is near a first segment of the frame portion; and the contact between the second conductor and the second portion of the sensing region is near a second segment of the frame portion, substantially opposite the first segment.

6. A transducer as in claim 5 wherein the doping of the sensing region is non-uniform along a direction normal to the surface of the web portion.

7. A transducer as in claim 1 wherein:

the first portion of the sensing region is a first conductivity type;

the second portion of the sensing region is a second conductivity type; and a rectifying junction is formed between the first and second portions of the sensing region.

* * * * *